(12) United States Patent
Hu et al.

(10) Patent No.: US 11,506,884 B2
(45) Date of Patent: Nov. 22, 2022

(54) MEMS OPTICAL CIRCUIT SWITCH

(71) Applicant: Molex, LLC, Lisle, IL (US)

(72) Inventors: Gongjian Hu, Seaside, CA (US);
Kelvin Chau, Pleasanton, CA (US);
Lifu Gong, San Jose, CA (US)

(73) Assignee: Molex, LLC, Lisle, IL (US)

( * ) Notice: Subject to any disclaimer, the term of this patent is extended or adjusted under 35 U.S.C. 154(b) by 727 days.

(21) Appl. No.: 16/274,311

(22) Filed: Feb. 13, 2019

(65) Prior Publication Data
US 2020/0257106 A1 Aug. 13, 2020

(51) Int. Cl.
*G02B 26/08* (2006.01)
*B81B 7/02* (2006.01)

(52) U.S. Cl.
CPC ............ *G02B 26/0833* (2013.01); *B81B 7/02* (2013.01); *B81B 2201/045* (2013.01)

(58) Field of Classification Search
CPC .......................... G02B 26/0833; G02B 6/3546; G02B 6/3556; G02B 6/357; G02B 6/3512; B81B 7/02; B81B 2201/045
USPC ................................................. 359/290–292
See application file for complete search history.

(56) References Cited

U.S. PATENT DOCUMENTS 6,668,108 B1 * 12/2003 Helkey .................. G02B 6/359
385/17

OTHER PUBLICATIONS

Kawajiri, Yuko et al., "512 × 512 Port 3D MEMS Optical Switch Module with Toroidal Concave Mirror", NTT Technical Review, vol. 10, No. 11, Nov. 2012, pp. 66-72.
Kim, J. et al., "1100 × 1100 Port MEMS-Based Optical Crossconnect With 4-dB Maximum Loss", IEEE Photonics Technology Letters, vol. 15, No. 11, Nov. 2003, pp. 1537-1539.

* cited by examiner

*Primary Examiner* — James C. Jones (57) ABSTRACT

An optical circuit switch device and method for using the device are provided. The device may include a fiber array including a set of optical fibers configured for transmitting optical signals. The device may include a collimator array coupled to the fiber array configured for aligning the optical signals received from the fiber array. The device may include a first mirror array for receiving the optical signals from the collimator array. The device may include a second mirror array for receiving the optical signals from the first mirror array. The device may include a lens located at the fiber array, the lens having a focal point at the second mirror array.

20 Claims, 8 Drawing Sheets

MEMS OPTICAL CIRCUIT SWITCH

BACKGROUND

Field

The present disclosure relates to the field of optical networks, and more particularly, but not exclusively, to the field of micro-electro-mechanical systems (MEMS) circuit switches.

Background

Optical circuit switches (OCSs) or photonic cross-connects (PXCs) are at the heart of optical circuit switching networks. An OCS may include a number of optical collimators which may direct optical signals into and out of optical fibers coupled to the OCS. The optical collimators may direct the optical signals to the output via a series of MEMS micro-lens array, or a mirror array.

While OCSs have provided benefits over non-switching optical networks or those optical networks having optical-electrical-optical transitions, the increasing data loads and limitations of fixed network topologies have suggested a need for an improved optical circuit switch including configurable, efficient, compact, and scalable features. There may be a need for an improved OCS that better utilizes the full-scanning range of the optical elements.

SUMMARY

In an aspect of the disclosure, an optical circuit switch device is provided. The device may include a fiber array including a set of optical fibers configured for transmitting a set of optical signals. The device may include a collimator array coupled to the fiber array configured for aligning the optical signals received from the fiber array. The device may include a first mirror array for receiving the optical signals from the collimator array. The device may include a second mirror array for receiving the optical signals from the first mirror array. The device may include a lens located at the collimator array, the lens having a focal point at the second mirror array.

In another aspect of the disclosure, a circuit switch device is provided. The device may include an optical transmission means configured for transmitting a set of optical signals. The device may include a first reflective means for receiving the optical signals from the optical transmission means. The device may include a second reflective means for receiving the optical signals from the first reflective means. The device may include a transmissive means located at the optical transmission means, the transmissive means having a converging point at the second reflective means.

In another aspect of the disclosure, a method for switching a set of signals in an optical switching device is provided. The method may include selectively grouping the set of signals for transmission through the optical switching device. The method may include controlling mirrors in a first mirror array to selectively pass each signal of the set of signals received through a lens having a focal point at a second mirror array.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. It will, however, be apparent to those skilled in the art that these concepts may be practiced without these specific details. In some instances, well known structures and components are shown in block diagram form in order to avoid obscuring such concepts.

Disclosed herein is an optical switching device (OCS) including one or more lenses configured within the device for focusing input and output signals of the device. The lenses may be called field lenses or focusing lenses that may decrease the beam divergence angles and extend the Rayleigh length or range. The field lenses or focusing lenses may effectively reduce beam diffraction losses. The OCS may include collimator arrays for input and output signals, micro-electro-mechanical systems (MEMS) micro-mirror arrays (hereinafter "MEMS array"), and lenses coupled to the collimators that focus the signals on the MEMS arrays. Micro-mirror or mirror may be used interchangeably in the disclosure. In one or more aspects of the disclosure, the collimator device may include a fiber array for receiving or transmitting optical signals at the switching device. An optical lens array may be aligned and optically coupled to the fiber array.

Figure 1A:
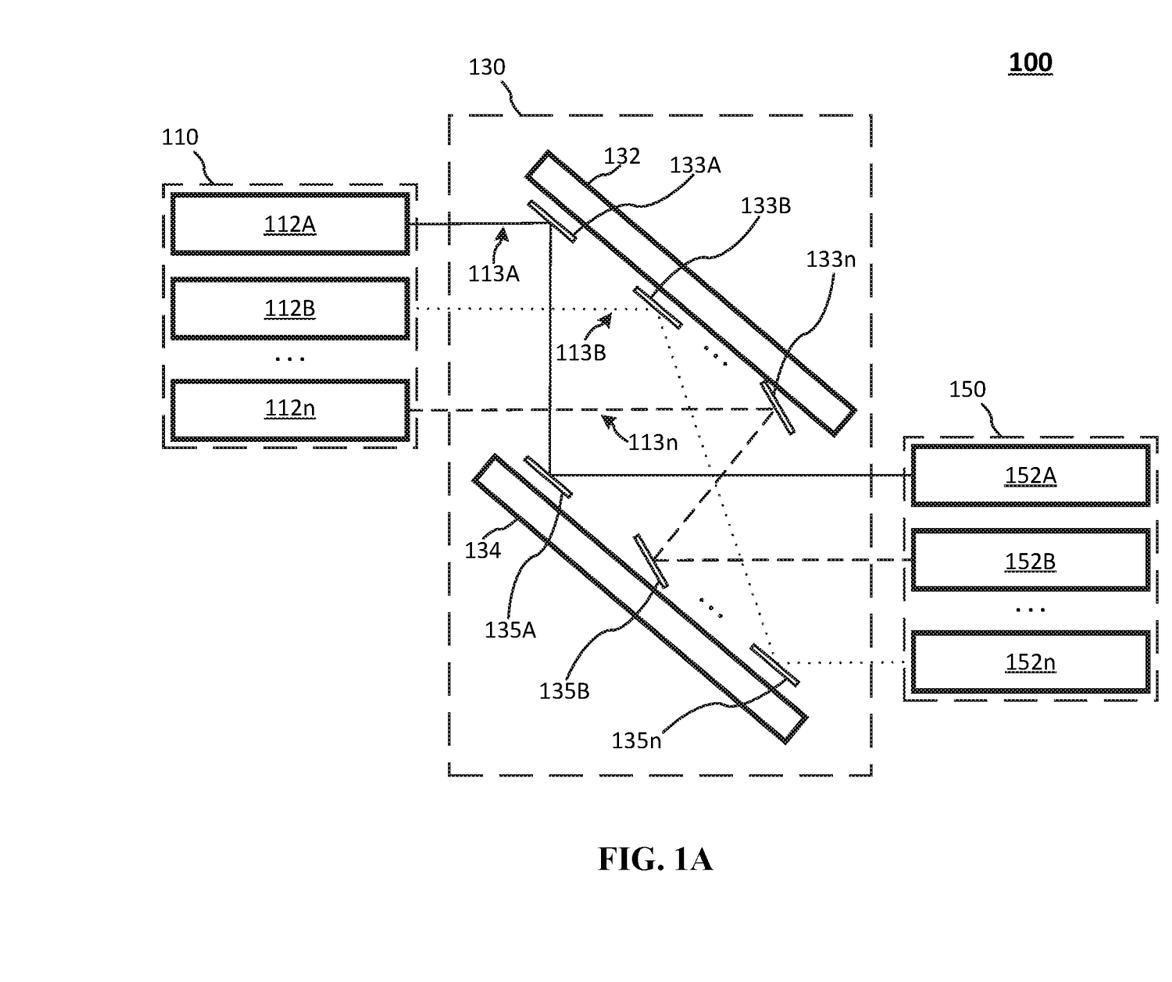
FIGS. 1A-D are diagrams illustrating an example of an optical circuit switch (OCS), another example OCS with MEMS micro-mirror tilt in various configurations, a micro-mirror controlled by three electrodes, and a micro-mirror controlled by four electrodes, in accordance with one or more embodiments of the disclosure.

FIG. 1A is a diagram illustrating an example of an OCS 100, in accordance with one or more aspects of the disclosure. The OCS 100 may be an all-optical switching matrix including input collimators 110 including n number of collimator elements (e.g., 112A, 112B, . . . , 112n), a MEMS array 130 including n number of micro-mirror elements (e.g., micro-mirror elements 133A, 133B, . . . , 133n on substrate 132 and micro-mirror elements 135A, 135B, . . . , 135n on substrate 134), and an output collimator 150 including n number of collimator elements (e.g., 152A, 152B, . . . , 152n). For example, a collimator may narrow a beam or align the beam for output through the collimator. The input collimators 110 may include multiple collimators that may be coupled to an n number of optical fibers. An input optical signal may enter the input collimators 110 through the optical fibers for transmission through the device 100. The signal transmitted through each optical fiber may include one or more optical wavelengths ($\lambda_i$). Output light from the output collimators 150 (e.g., reaching the collimators 150 from collimators 110 via paths 113A, 113B, . . . , 113n) may be provided to a set of output optical fibers, each carrying a signal at one or more optical wavelengths ($\lambda_i$). The paths 113A, 113B, 113n may represent light or beam paths.

The collimator elements of the collimators 110, 150 may be separate individual collimators or combined into a collimator array, as shown, for example, in FIGS. 3B-E. The input and output collimators 110, 150 may be structurally similar and are described in more detail below. The MEMS array 130 may be a MEMS-based micro-mirror array that may selectively direct optical beams from individual optical fibers coupled to the input collimators 110 to selected optical fibers coupled to the output collimators 150. The MEMS array 130 may include two sets of micro-mirror arrays 132, 134 each having an n number of micro-mirrors (133A, 113B, . . . , 113n, 135A, 135B, . . . , 135n) formed on a substrate 132, 134 (in this disclosure 132, 134 may refer to the substrate or to the micro-micro array associated with the substrate 132, 134). Arrays 132, 134 and their constituent elements may be referred to as opposing, facing, or adjacent elements. The substrate may serve as a foundation for the micro-mirror elements.

The state of each micro-mirror may be controlled by applying a voltage between two or more electrodes associated with each micro-mirror in the MEMS array 130. For example, by rotating the micro-mirrors in the MEMS array 130, a signal from any input fiber coupled to the input collimators 110 may be passed to any output fiber coupled to the output collimators 150. In some embodiments, the voltage may have a maximum value or may be limited such that the micro-mirrors have a maximum tilt angle or scanning range. One skilled in the art will recognize that control of the micro-mirrors may be effected by other means and forms of actuation including, for example, mechanical, electromagnetic, or chemical processes.

Figure 1B:
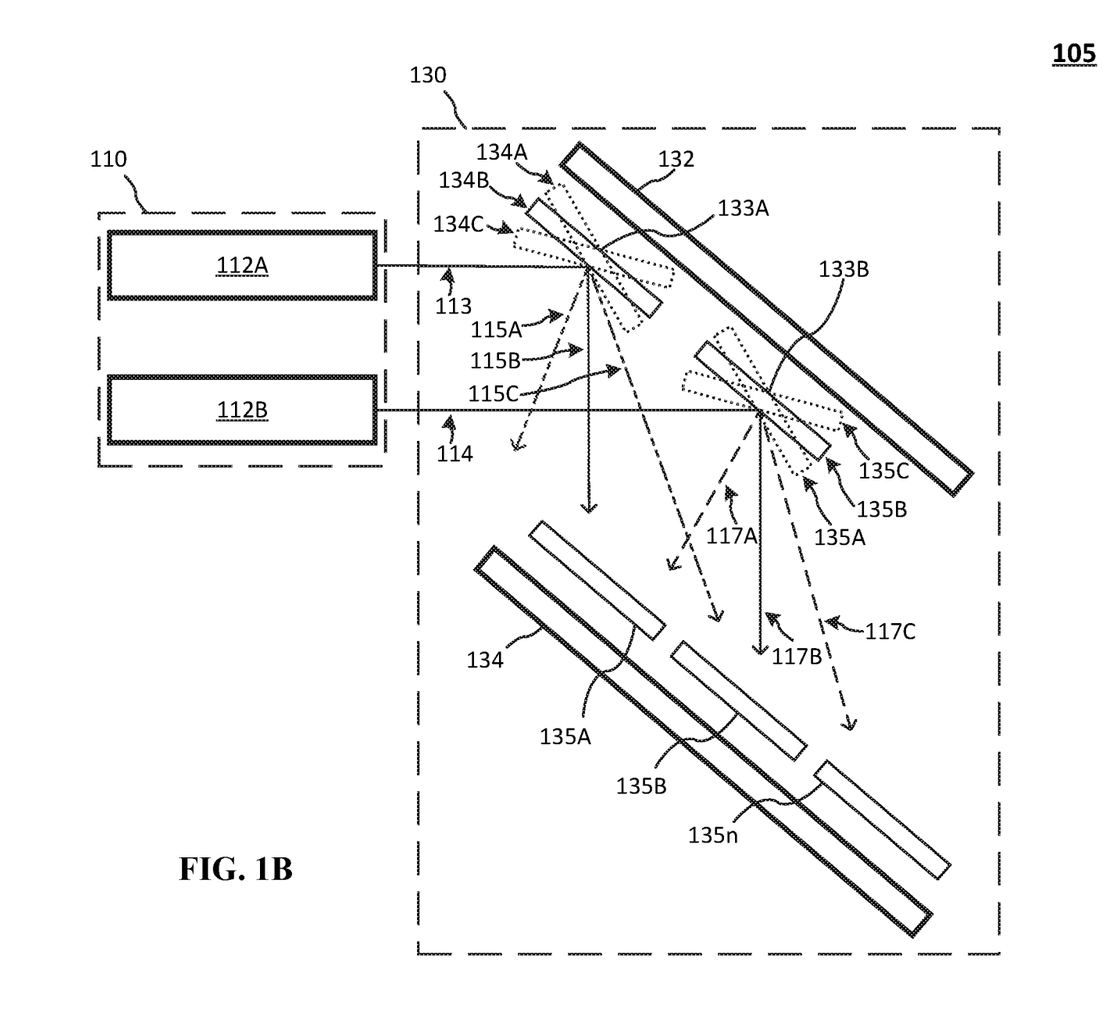

FIG. 1B is a diagram illustrating another example of an OCS 105 including a MEMS array 130 in various micro-mirror tilt configurations. The OCS 105 may be the OCS 100 of FIG. 1A. The MEMS array 130 may be the MEMS array of FIG. 14. Some elements of the OCS 105 are omitted for ease of illustration. The top MEMS array associated with substrate 132 may be configured to reflect, direct, or steer signals to the bottom MEMS array associated with substrate 134. Controllably directing signals from one MEMS array to another may be achieved by control of the tilt angle using applied voltages at the micro-mirrors of the MEMS arrays. While it may be possible to increase the tilt angle (e.g., by applying a higher voltage) to reach more micro-mirrors of an opposing MEMS array, some embodiments may include a maximum voltage that limits the micro-mirrors to a maximum tilt angle.

In the example illustrated in FIG. 1B, rotation enables the micro-mirror 133B to direct signals from the collimator 112B to the three opposing micro-mirrors 135A, 135B, 135n. For example, the micro-mirror 133B may have a neutral or zero angle configuration 135B such that an incident beam 114 from the collimator 112B is directed in the direction of path 117B toward micro-mirror 135B; the micro-mirror 133B may have a maximum angle configuration in a first direction 135A (illustrated as a clockwise rotation in FIG. 1B) such that the incident beam 114 is directed in the direction of path 117A toward micro-mirror 135A; micro-mirror 133B may have a maximum angle in a second direction 135C (illustrated as a counter-clockwise rotation in FIG. 1B) such that the incident beam 114 is directed in the direction of path 117C toward micro-mirror 135n. Thus, the micro-mirror 133B may be controlled to direct signals to the three opposing micro-mirrors 135A, 135B, 135n.

Not all micro-mirrors in FIG. 1B, however, may be controlled to direct signals to the three opposing micro-mirrors 135A, 135B, 135n. For example, the micro-mirror 133A may have a maximum angle configuration in a first direction 134A (illustrated as a clockwise rotation in FIG. 1B) such that the incident beam 113 from the collimator 112A is directed in the direction of path 115A away from the opposing micro-mirrors 135A, 135B, 135n. Other angle configurations may direct signals to some of the opposing micro-mirrors. For example, the micro-mirror 133A may have a neutral or zero angle configuration 134B such that the incident beam 113 is directed in the direction of path 115B toward micro-mirror 135A; the micro-mirror 133A may have a maximum angle configuration in a second direction 134C (illustrated as a counter-clockwise rotation in FIG. 1B) such that the incident beam 113 is directed in the direction of path 115C toward micro-mirror 135B.

As illustrated in FIG. 1B, it may not be possible to control micro-mirror 133A to direct signals to at least one opposing micro-mirror 135n. In addition, control of the micro-mirror 133A in one direction (illustrated as a counter-clockwise rotation in FIG. 1B) directs incident beams away from the opposing MEMS array 134. Accordingly, some of the angle configurations may not be usable in the example OCS 105. It may be beneficial to reconfigure or augment OCS 105 to enable better usage of the tilt angles. One possible example configuration addressing this issue by incorporating focusing lenses is presented below with respect to FIG. 2.

Figure 1C:
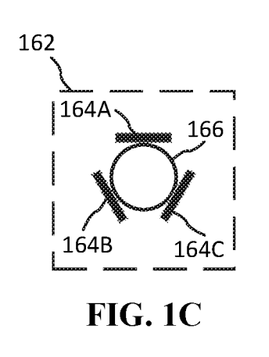
Figure 1D:
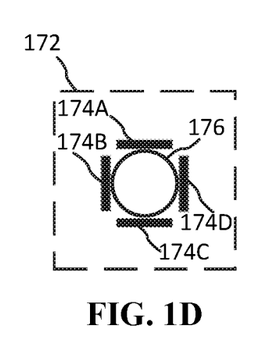

FIGS. 1C-D are diagrams illustrating control of the micro-mirrors using a set of electrodes. Control of the micro-mirrors may be performed by applying a voltage between electrodes associated with the micro-mirror. In some embodiments the angle adjustment may be a linear function of the voltage applied; in some embodiments the angle adjustment may be a non-linear function of the voltage applied. When sets of electrodes are coupled to the micro-mirror, the micro-mirror may be controlled in at least two axes (e.g., x-axis, y-axis) with the set of electrodes controlling the motion.

The example of FIG. 1C shows an exemplary micro-mirror configuration 162 including a micro-mirror 166 and three electrodes 164A, 164B, 164C that may be offset at 180 degrees from each other.

The example of FIG. 1D shows an exemplary micro-mirror configuration 172 including a micro-mirror 176 and four electrodes 174A, 174B, 174C, 174D that may be placed at 90-degree offsets. Each of the opposing pair of electrodes (e.g., 174A & 174C, 174B & 174D) may control tilt in the axis defined by the pair of electrodes.

Figure 2:
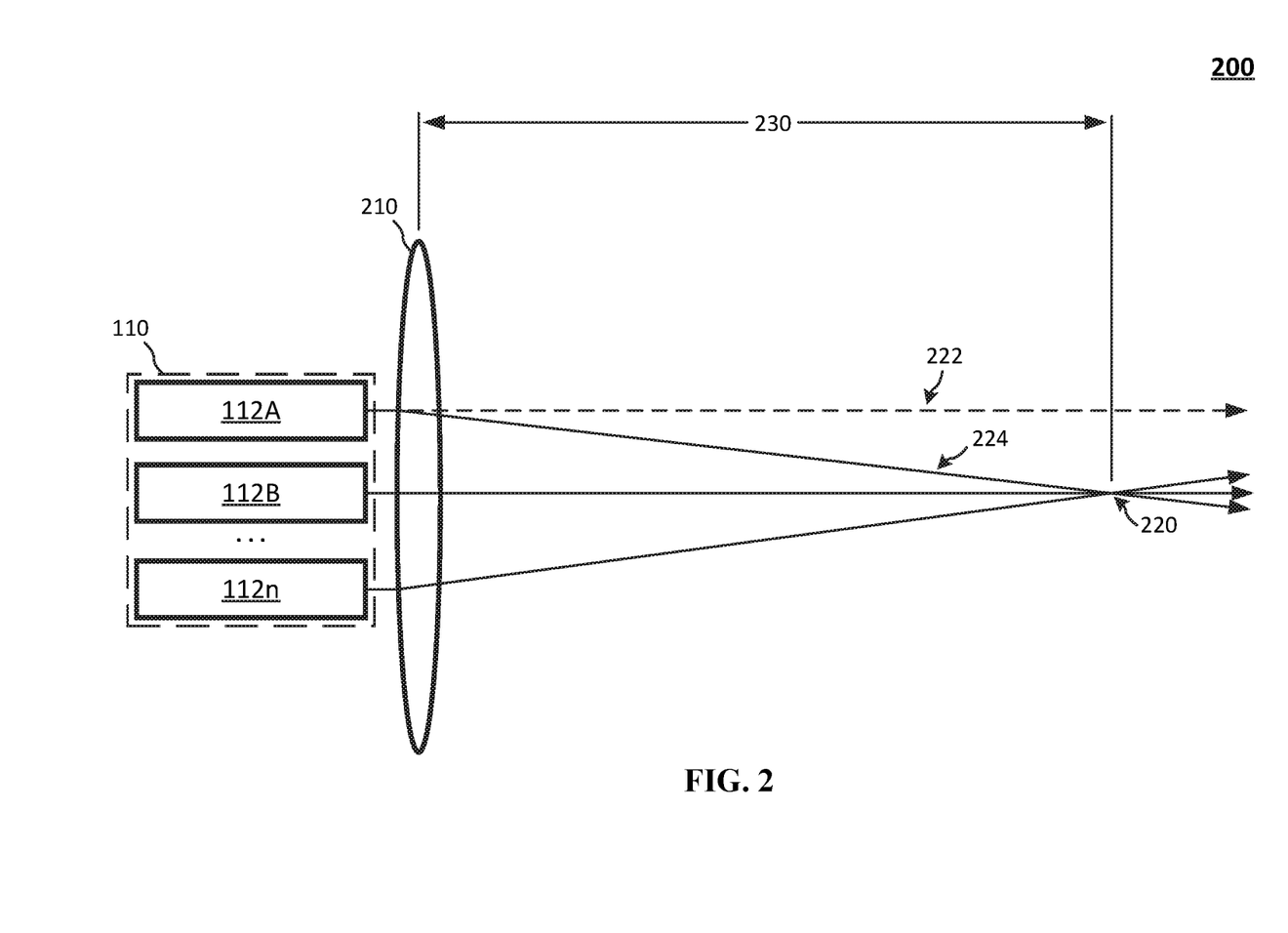
FIG. 2 is a diagram illustrating a lens coupled to a collimator array for focusing the signals to a focal point, in accordance with one or more aspects of the disclosure.

FIG. 2 is a diagram illustrating a lens 210 coupled to collimators 110 for focusing the signals from the collimators 110 to a focal point 220, in accordance with one or more aspects of the disclosure. Lens 210 may be a positive powered lens (i.e., the lens converges light passing the lens 210). The optical power may also be referred to as dioptric power, refractive power, focusing power, or convergence power, and is the degree to which the system converges or diverges light. Optical power may be equal to the reciprocal of the focal length 230 of the lens 210, such that power equals 1/f, where f is the focal length. While lens 210 is illustrated as a positive powered lens, one skilled in the art will readily recognize that the means may take various forms including a prism, a negative powered lens, etc.

As previously illustrated, such as in FIG. 1B, in some configurations beams reflecting off a micro-mirror may not reach all available micro-mirrors of an opposing MEMS array because the micro-mirrors may have a maximum tilt angle. The embodiment illustrated in FIG. 2 shows an example configuration that may address this problem. Lens 210 may be placed in front of collimators 110 to focus the beams (e.g., 224) from collimators 110 at a focal point 220. With reference back to FIG. 1B, the lens 210 in FIG. 2 may shift or converge the beam paths 115A, 115B, 115C toward a central point of substrate 134 such that the beam paths may be able to reach all micro-mirrors on substrate 134 (e.g., directed toward micro-mirrors 135A, 135B, 135n, respectively). In the example of FIG. 2, the beam path 222 from collimator 112A may diverge from the focal point 220 without use of the lens 210. With use of the lens 210, the same beam from collimator 112A is now focused as beam path 224 and converges on the focal point 220. The focal point 220 may be the center or approximate center of a MEMS array.

Figure 3A:
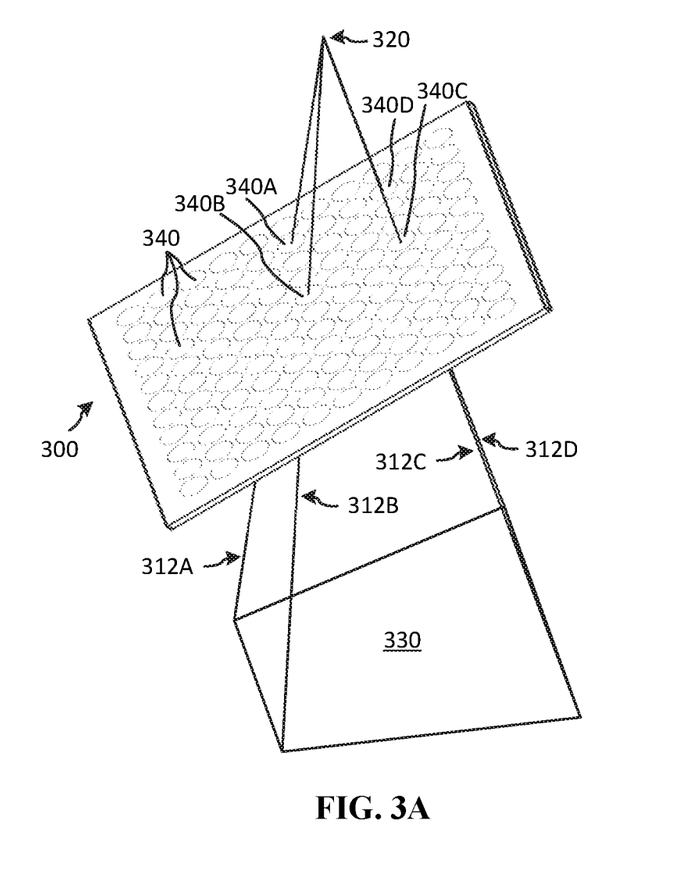
FIGS. 3A-E are diagrams illustrating an example MEMS array matrix with a projection of light paths from a focal point, a collimator configuration having fixed pitch, a collimator configuration having scaled pitch, micro-mirror elements arranged in a square matrix, and micro-mirror elements arranged in a circular matrix, in accordance with one or more aspects of the disclosure.

FIG. 3A is a diagram illustrating a MEMS array 300 with individual micro-mirror elements arranged in a square grid matrix, in accordance with one or more aspects of the disclosure. In one embodiment, the MEMS array 300 may have micro-mirrors 340 with a pitch (distance between centers of adjacent micro-mirrors) that is uniform between all sets of adjacent micro-mirrors. In another embodiment, the pitch may be scaled and non-uniform.

In some embodiments, the pitch may be the same between all adjacent collimators, as shown in FIG. 3A. In other embodiments, the pitch may be variable or scaled (e.g., as illustrated in FIG. 3D).

The example of FIG. 3A illustrates light paths centered at focal point 320 passing through the MEMS array 300. As illustrated, the paths 312A, 312B, 312C, 312D may pass through the MEMS array 300. Because the MEMS array 300 matrix assembly may be offset at an angle to the focal point 320, locations (e.g., 340A, 340B, 340C, 340D) on the MEMS array 300 surface may be at different distances to the focal point 320—e.g., 340A, 340B are farther away than 340C, 340D. This difference in distances causes the projection of paths 312A, 312B, 312C, 312D from the focal point 320 to form a trapezoidal 330 or keystone shape. Area 330 may represent the location of collimators within the OCS device. In some embodiments, the collimators may be arranged to match the keystone shape 330, as described below in FIG. 3C.

Figure 3B:
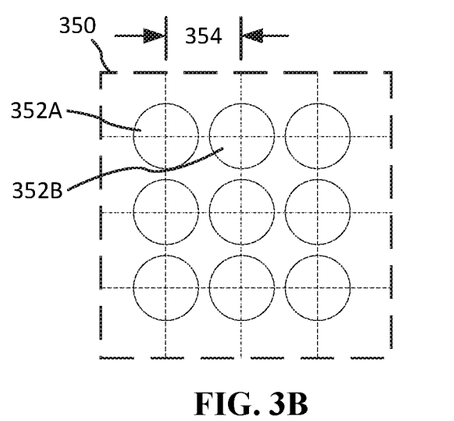

FIG. 3B illustrates a collimator configuration 350 of collimator elements having a regular uniform pitch 354. For example, when the collimator elements (e.g., 352A, 352B) are arranged at evenly spaced intervals of the matrix, the pitch of adjacent collimator elements may be uniform 354. While this arrangement may be acceptable in certain designs, the arrangement of the collimator elements may be adjusted to beneficially account for the resulting shape of light projection illustrated in FIG. 3A.

Figure 3C:
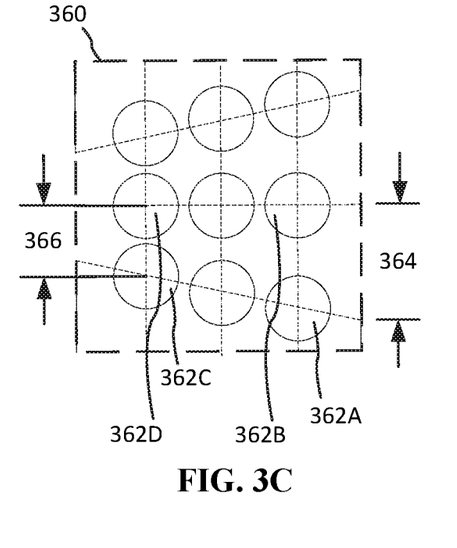
Figure 3D:
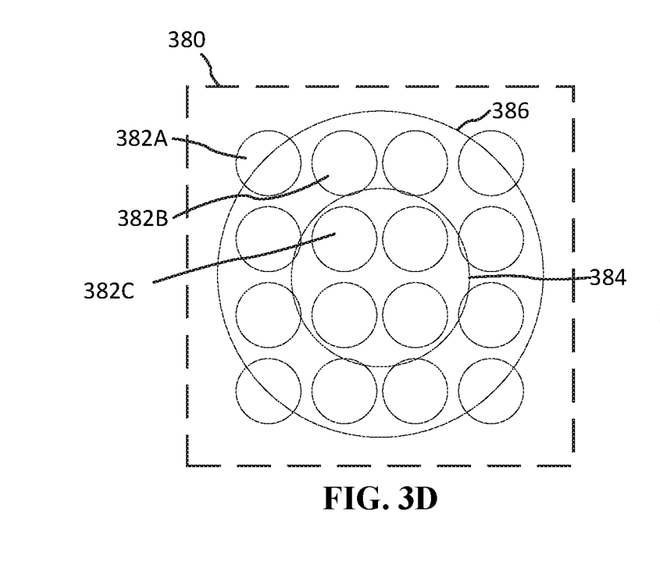

FIG. 3C illustrates a collimator configuration 360 of collimator elements having scaled pitch. For example, the scaling may reflect the trapezoidal shape 330 of light projection as illustrated in FIG. 3A. When the pitch is scaled, the collimator elements may better match the light paths that original or terminate at a focal point. With a trapezoidal shape, the pitch may be non-uniform where the pitch 364 may be larger on the right side of the configuration 360 between micro-mirrors 362A, 362B. The pitch 366 may be smaller at the left side of the configuration 360 between micro-mirrors 362C, 362D. The pitch values of adjacent pairs between the ends may be linearly scaled.

Figure 3E:
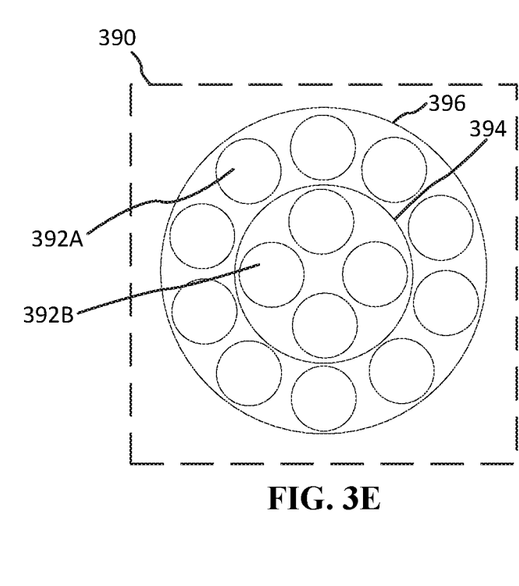

FIGS. 3D-E are diagrams illustrating two configurations of micro-mirror arrangements, in accordance with aspects of the disclosure. In FIG. 3D, the example configuration 380 includes an arrangement of micro-mirror elements in a uniform square matrix, similar to the arrangement of collimator elements discussed in FIG. 3B. The circle areas 384, 386 may show the potential reach of light paths coming from a device rotating at a fixed angle such as an opposing micro-mirror controlled at a fixed voltage. For example, circle area 384 may illustrate the reach of light from a micro-mirror rotating at a smaller angle. Circle area 384 encloses four micro-mirror elements including micro-mirror element 382C.

Circle area 386 may illustrate the reach of an opposing micro-mirror rotating at a larger angle. Circle area 386 encloses eight additional micro-mirror elements (in addition to the four micro-mirror elements enclosed by circle area 384) including micro-mirror element 382B. Circle area 386 may not enclose or reach some micro-mirror elements such as micro-mirror element 382A. With larger circle areas more micro-mirror elements may be addressed by an opposing micro-mirror at the expense of needing higher voltages.

In FIG. 3E, the example micro-mirror configuration 390 includes an arrangement of micro-mirror elements in a circular pattern. The circle areas 394, 396 show the potential reach of light paths coining from a device rotating at a fixed angle such as an opposing micro-mirror controlled at a fixed voltage. For example, circle area 394 may illustrate the reach of an opposing micro-mirror rotating at a smaller angle. Circle area 394 may enclose four micro-mirror elements including collimator element 392B. Circle area 396 may illustrate the reach of a micro-mirror rotating at a larger angle. Circle area 396 may enclose ten additional micro-mirror elements (in addition to the four micro-mirror elements enclosed cy circle area 394) including micro-mirror element 392A.

The example configuration 390 shows that in a circular arrangement of micro-mirror elements, an opposing micro-mirror may be able to reach more micro-mirror elements at a given angle and voltage than a square arrangement of micro-mirror elements; fourteen micro-mirror elements fit within circle area 396 whereas only twelve fit within circle area 386.

Returning to FIG. 3D, in some embodiments a micro-mirror array may be pre-configured in a square matrix or other regular matrix pattern that cannot be reconfigured into a circular pattern. In such instances, control of an OCS may be improved by grouping the micro-mirrors into circular groupings such as those of circles 384, 386. Accordingly, a circular arrangement or pattern may refer to a physical layout of micro-mirror elements or to a logical grouping of the micro-mirror elements.

Those skilled in the art will readily recognize that other configurations of an OCS may be possible. Any combination may be possible of the various collimator and micro-mirror arrangements including scaled collimator pitch, circular, hexagonal, or other micro-mirror arrangements based on user needs.

Figure 4:
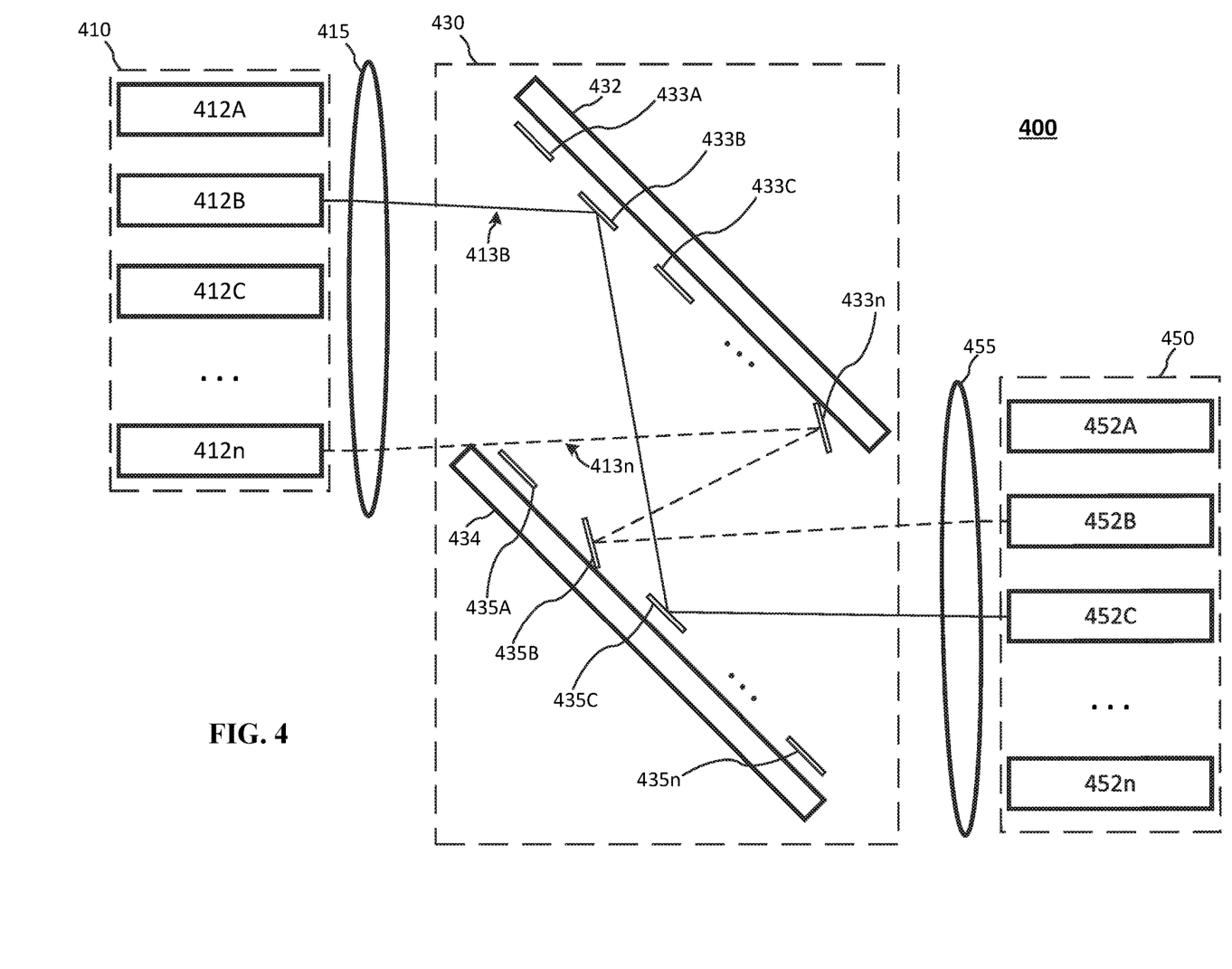
FIG. 4 is a diagram illustrating another example OCS that includes two lenses used for focusing input and output beams to and from MEMS arrays, in accordance with one or more aspects of the disclosure.

FIG. 4 is a diagram illustrating another example OCS 400 that includes two lenses 415, 455 used for focusing input and output beams to and from MEMS arrays 430, in accordance with one or more aspects of the disclosure. OCS 400 may include similar components from FIG. 1A. OCS 400 may be an all-optical switching matrix including input collimators 410 including n number of collimator elements (e.g., 412A, 412B, 412C, . . . , 412n), a MEMS array 430 that may be controlled to pass beams from any input collimator element of array 410 to any output collimator element of array 450. The OCS 400 may include a lens element 415 that has a focal point at MEMS array 434. For example, the lens 415 may have a focal point at the center or approximate center of MEMS array 434. The OCS 400 may include a lens element 455 that has a focal point at MEMS array 432. For example, the lens 455 may have a focal point at the center or approximate center of MEMS array 430. In the example of FIG. 4, lens 455 may be configured to pass the beams such that they are normal to (or parallel to the direction of) the input at each respective collimator element 452A, 452B, 453C, . . . , 452n of the collimator array 450.

The input collimators 410 may include multiple collimators that may be coupled to an n number of optical fibers. An input optical signal transmitted through each optical fiber may include one or more optical wavelengths ($\lambda_i$). Output light from the output collimators 450 including collimator elements 452A, 452B, 452C, . . . , 452n (e.g., reaching the collimators 450 via paths 413B, 413n) may be provided to a set of output optical fibers, each carrying a signal at one or more optical wavelengths ($\lambda_i$). Paths 413B, 413n may represent light or beam paths. Path 413B may be a collimated beam from collimator 412B passing through lens 415 that focuses the beam towards the center or approximate center of array 434. Path 413n may be a collimator beam from collimator 412n passing through lens 415 that focuses the beam towards the center or approximate center of array 433n.

The collimators 410, 450 may be separate individual collimators or combined into a collimator array as shown, for example, in FIGS. 3A-E. The input and output collimators 410 and 450 may be structurally similar. The MEMS array 430 may be a MEMS-based micro-mirror array that may selectively direct optical beams from individual optical fibers coupled to the input collimators 410 to selected optical fibers coupled to the output collimators 450 via lenses 410, 420. The MEMS array 430 may include two sets of micro-mirror arrays 432 (including micro-mirrors 433A, 433B, 433C, . . . , 433n), 434 (including micro-mirrors 435A, 435B, 435C, . . . , 435n) each having an n number of micro-mirrors formed on substrates 432, 434 (in this disclosure 432, 434 may refer to the substrate or to the micro-micro array associated with the substrate 432, 434). The state of each micro-mirror may be biased by applying a voltage or electric charge between two or more electrodes associated with each micro-mirror in the MEMS array 430. In an un-biased state, no voltage may be applied to the micro-mirror. In a biased state, for example, by applying a voltage and rotating the micro-mirrors in the MEMS array 430, a signal from any input fiber coupled to the input collimators 410 may be directed to any output fiber coupled to the output collimators 450.

In the example of FIG. 4, micro-mirror 433B may be in an un-biased state (e.g., no voltage or charge is applied) such that the beam path 413B is focused towards the center or approximate center of MEMS array 434, illustrated as 435C in FIG. 4. With the addition of the lens 415, beams may be directed to the entire MEMS array 434 (e.g., any micro-mirror 435A, 435B, 435C, . . . , 435n) biasing the micro-mirror (e.g., 433B) through the full-scanning range.

Micro-mirror 433n may be in a biased state (e.g., with a voltage or charge applied) such that the beam path 413n may be focused towards a desired micro-mirror of MEMS array 434, which is 435B in FIG. 4.

Lenses 415 and 455 may be structurally similar and may include a matched set of lenses with similar properties. For example, the lenses 415 and 455 may have the same or substantially similar focal length. The OCS 400 may be designed symmetrically with corresponding input and output elements of OCS 400 having similar structure. For example, the MEMS arrays 432, 434 may be located at similar distances and offset angles from lenses 415, 455, respectively. When elements of the OCS 400 share common attributes, design and operation of the OCS 400 may be simplified. For example, control the MEMS arrays 132, 134 may be similar with each array 132, 134 sharing common control logic.

In some embodiments, either or both collimators 410, 450 may have collimator elements with regular pitch or scaled pitch (e.g., as illustrated in FIG. 3C). In another embodiment, either or both MEMS arrays 432, 434 may have elements arranged in a circular or hexagonal pattern (e.g., as illustrated in FIG. 3E). In some embodiments, when the collimators 410, 450 have scaled pitch and/or the MEMS arrays 432, 434 have circular/hexagonal patterns, the OCS 400 may be designed in a smaller package. In some embodiments, when the collimators 410, 450 have scaled pitch and/or the MEMS arrays 432, 434 have circular/hexagonal patterns, the device 400 have be designed with a larger number of micro-mirror elements n than one without either or both of the pitched and circular/hexagonal patterns. With the addition of lenses 415, 455, an OCS specified with a given maximum micro-mirror voltage may be designed with a larger port count. In addition, or in the alternative, an OCS may be designed in a smaller physical package for the same number of input/output ports.

While the lenses 415, 455 are illustrated as positive powered lenses, one skilled in the art will readily recognize that the means may take various forms including prisms, negative powered lenses, etc. In addition, other embodiments may employ passive or active elements.

Several aspects of optical switching systems will now be presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

Figure 5:
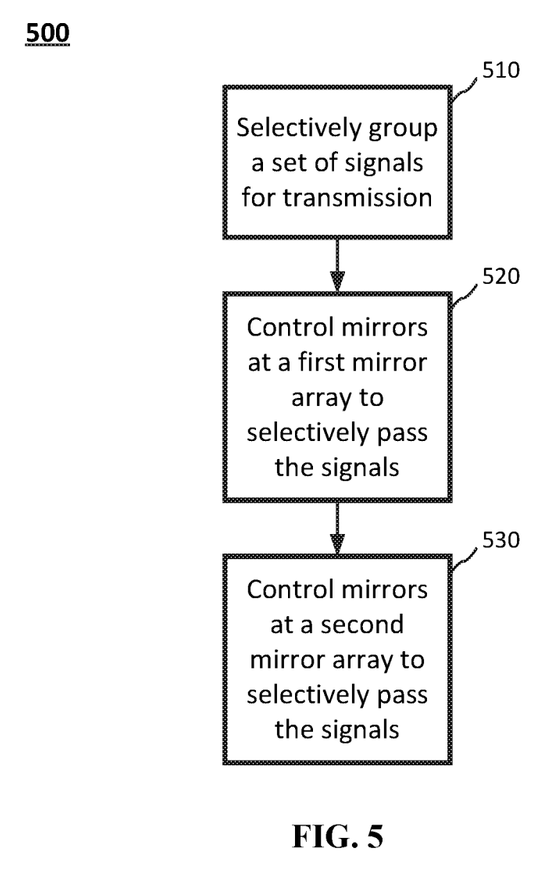
FIG. 5 is a flow chart illustrating an exemplary method for signal transmission through an exemplary device, in accordance with one or more aspects of the disclosure.

FIG. 5 is a flow chart illustrating an exemplary method for signal transmission through an exemplary device, in accordance with one or more aspects of the disclosure. For example, the flow chart 500 may illustrate grouping and passing signals through an OCS such as OCS 400 of FIG. 4. At 510, the method may selectively group a set of signals for transmission. For example, the signals may be a set of optical signals received from a fiber array for transmission through the OCS. The OCS may determine a path for the set of signals through the OCS.

At 520, the method may control mirrors at a first mirror array to selectively pass the signals. For example, the method may control the mirrors to pass a signal received from any input collimator element (e.g., 412A, . . . , 412n of FIG. 4) to any mirror in the output mirror array (e.g., 435A, . . . , 435n of FIG. 4).

At 530, the method may control mirrors of a second mirror array to selectively pass the signals, e.g., to the output collimator array. For example, a signal may be passed to any one of the output collimator elements (e.g., 452A, . . . , 452*n* of FIG. 4).

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. An optical circuit switch device, the device comprising:
   a fiber array comprising a plurality of optical fibers configured for transmitting optical signals;
   a collimator array coupled to the fiber array configured for aligning the optical signals received from the fiber array;
   a first mirror array for receiving the optical signals from the collimator array;
   a second mirror array for receiving the optical signals from the first mirror array; and
   a lens located at the collimator array, the lens having a focal point at the second mirror array.

2. The optical circuit switch device of claim 1, further comprising a second lens located at a second collimator array for outputting the optical signals, the second lens having a focal point at the first mirror array.

3. The optical circuit switch device of claim 2, wherein the focal point of the lens is at an approximate center of the second mirror array, and the focal point of the second lens is at an approximate center of the first mirror array.

4. The optical circuit switch device of claim 2, wherein the lens and the second lens comprise a matched set of lenses having a substantially similar focal length.

5. The optical circuit switch device of claim 2, further comprising:
   a second collimator array coupled to the second fiber array and the second lens, wherein the second collimator array comprises set of collimators having a collimator pitch defined by a distance between centers of adjacent collimator elements; and
   wherein the collimator array comprises a set of collimators having a collimator pitch defined by a distance between centers of adjacent collimator elements.

6. The optical circuit switch device of claim 5, wherein one or both of the collimator array and second collimator array comprise a set of collimator elements having a scaled pitch between adjacent collimator elements.

7. The optical circuit switch device of claim 5, wherein one or both of the first mirror array and second mirror array comprise a set of mirror elements having one of a circular, hexagonal, or square arrangement.

8. The optical circuit switch device of claim 1, further comprising a first substrate coupled to the first mirror array, the first substrate comprising a plurality of electrodes, wherein each mirror of the first mirror array is coupled to a set of electrodes for rotating each mirror about at least two axes.

9. The optical circuit switch device of claim 1, further comprising a second substrate coupled to the second mirror array, the second substrate comprising a plurality of electrodes, wherein each mirror of the second mirror array is coupled to a set of electrodes for rotating each mirror about at least two axes.

10. An optical circuit switch device, the device comprising:
    an optical transmission means configured for transmitting a plurality of optical signals;
    a first reflective means for receiving the optical signals from the optical transmission means;
    an alignment means coupled to the first reflective means configured for aligning the optical signals received from the first reflective means;
    a second reflective means for receiving the optical signals from the first reflective means; and
    a transmissive means located at the alignment means, the transmissive means having a converging point at the second reflective means.

11. The optical circuit switch device of claim 10, further comprising a second transmissive means located at a second alignment means for outputting the optical signals, the second transmissive means having a converging point at the first reflective means.

12. The optical circuit switch device of claim 11, wherein the converging point of the transmissive means is at an approximate center of the second reflective means, and the converging point of the second transmissive means is at an approximate center of the first reflective means.

13. The optical circuit switch device of claim 11, wherein the transmissive means and second transmissive means comprise a matched set of transmissive means having a substantially similar converging distance.

14. The optical circuit switch device of claim 11, further comprising:
    a second alignment means coupled to the second optical transmission means and the second transmissive means, wherein the second alignment means comprises a set of alignment elements having a pitch defined by a distance between centers of adjacent alignment elements; and
    wherein the alignment means comprises a set of alignment elements having a pitch defined by a distance between centers of adjacent alignment elements.

15. A method for switching a set of signals in an optical switching device, the method comprising:
    selectively grouping the set of signals for transmission through the optical switching device; and
    controlling mirrors in a first mirror array to selectively pass each signal of the set of signals received through a lens having a focal point at a second mirror array.

16. The method of claim 15, further comprising controlling mirrors in the second mirror array to selectively pass each signal of the set of signals to an output through a second lens having a focal point at the first mirror array.

17. The method of claim 16, wherein the focal point of the lens is at an approximate center of the second mirror array, and the focal point of the second lens is at an approximate center of the first mirror array.

18. The method of claim 16, wherein controlling mirrors of the first mirror array and the second mirror array is based on a matched set of lenses for the lens and the second lens.

19. The method of claim 16, further comprising:
transmitting the signals through the lens via a first collimator array; and
transmitting the signals through the second lens for output via a second collimator array.

20. The method of claim 19, wherein controlling mirrors of the first mirror array and the second mirror array is based on the first collimator array and the second collimator array having a scaled pitch, or the first mirror array and second mirror array having a circular, hexagonal, or square arrangement.

* * * * *